(12) United States Patent
Lie et al.

(10) Patent No.: US 9,748,380 B1
(45) Date of Patent: Aug. 29, 2017

(54) VERTICAL TRANSISTOR INCLUDING A BOTTOM SOURCE/DRAIN REGION, A GATE STRUCTURE, AND AN AIR GAP FORMED BETWEEN THE BOTTOM SOURCE/DRAIN REGION AND THE GATE STRUCTURE

(71) Applicant: International Business Machines Corporation, Armonk, NY (US)

(72) Inventors: Fee Li Lie, Albany, NY (US); Shogo Mochizuki, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/197,279

(22) Filed: Jun. 29, 2016

(51) Int. Cl.
*H01L 29/78* (2006.01)
*H01L 29/06* (2006.01)
*H01L 29/08* (2006.01)
*H01L 29/66* (2006.01)
*H01L 21/764* (2006.01)

(52) U.S. Cl.
CPC ........ *H01L 29/7827* (2013.01); *H01L 21/764* (2013.01); *H01L 29/0649* (2013.01); *H01L 29/0847* (2013.01); *H01L 29/66666* (2013.01)

(58) Field of Classification Search
CPC ............. H01L 29/7827; H01L 29/0649; H01L 29/0847; H01L 29/66666
See application file for complete search history.

(56) References Cited

U.S. PATENT DOCUMENTS

| 8,502,287 | B2 | 8/2013 | Radic et al. | |
| 8,637,384 | B2* | 1/2014 | Ando | H01L 29/785 |
| | | | | 257/347 |
| 8,912,602 | B2* | 12/2014 | Hsu | H01L 29/66795 |
| | | | | 257/347 |
| 9,059,203 | B2 | 6/2015 | Furukawa et al. | |
| 9,112,052 | B2* | 8/2015 | Chen | H01L 21/82348 |
| 9,224,841 | B2* | 12/2015 | Harame | H01L 21/76224 |
| 9,252,233 | B2* | 2/2016 | Hsiao | H01L 29/515 |
| 9,269,814 | B2 | 2/2016 | Hsu | |
| 9,299,835 | B1* | 3/2016 | Anderson | H01L 29/7827 |
| 9,368,572 | B1* | 6/2016 | Cheng | H01L 29/7827 |
| 9,536,982 | B1* | 1/2017 | Cheng | H01L 29/6656 |
| 2014/0264491 | A1 | 9/2014 | Huang et al. | |
| 2016/0027727 | A1* | 1/2016 | Kim | H01L 23/528 |
| | | | | 257/774 |
| 2016/0293697 | A1* | 10/2016 | Kim | H01L 29/0653 |
| 2016/0308008 | A1* | 10/2016 | Yeo | H01L 27/11 |
| 2016/0315081 | A1* | 10/2016 | Park | H01L 27/0886 |
| 2016/0351692 | A1* | 12/2016 | Huang | H01L 29/66795 |
| 2016/0359012 | A1* | 12/2016 | Yu | H01L 29/4991 |
| 2016/0365426 | A1* | 12/2016 | Ching | H01L 29/6656 |
| 2016/0372415 | A1* | 12/2016 | Siew | H01L 27/0886 |
| 2017/0033223 | A1* | 2/2017 | Leobandung | H01L 29/7851 |
| 2017/0040222 | A1* | 2/2017 | Anderson | H01L 29/7827 |

* cited by examiner

*Primary Examiner* — Ida M Soward
(74) *Attorney, Agent, or Firm* — Vazken Alexanian; McGinn IP Law Group, PLLC

(57) ABSTRACT

A vertical transistor includes a fin structure formed on a substrate, a gate structure formed on the fin structure, and a bottom source/drain (S/D) region formed on the fin structure, such that an air gap is formed between the bottom S/D region and the gate structure.

11 Claims, 17 Drawing Sheets

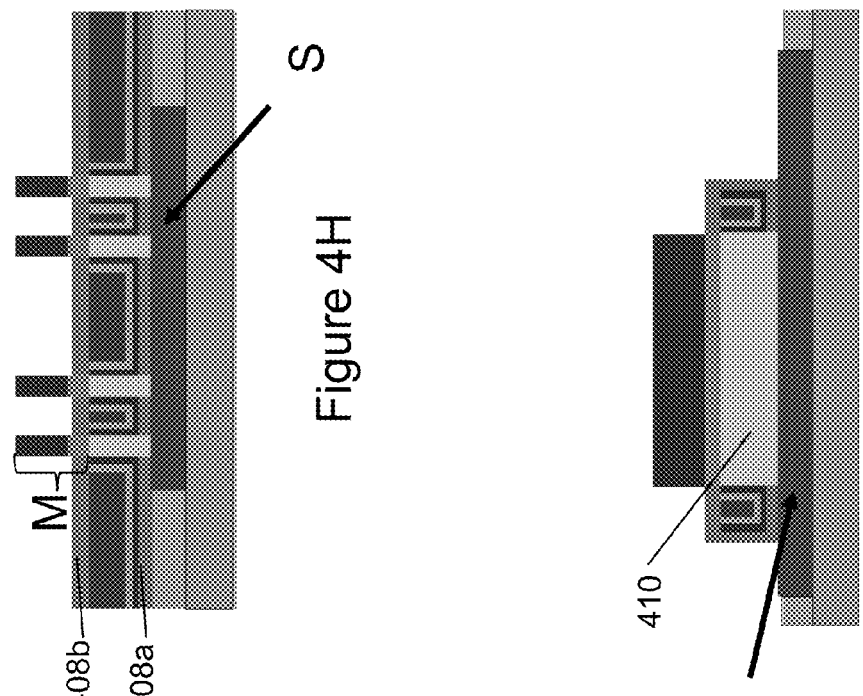
Figure 4H
Figure 4I
Figure 4G

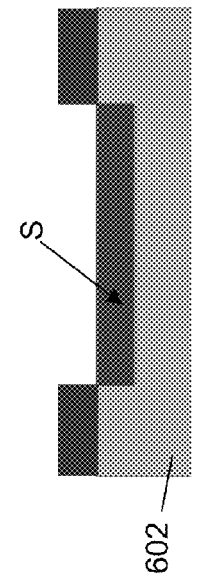
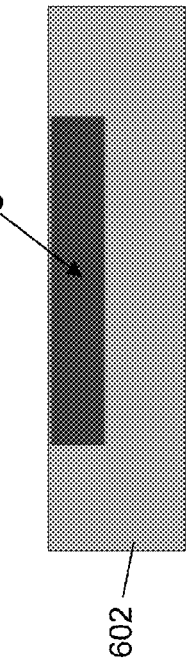
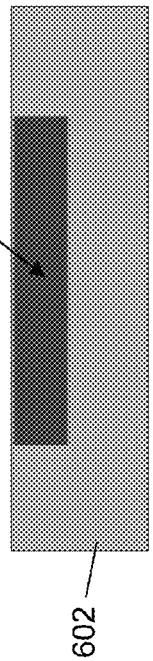
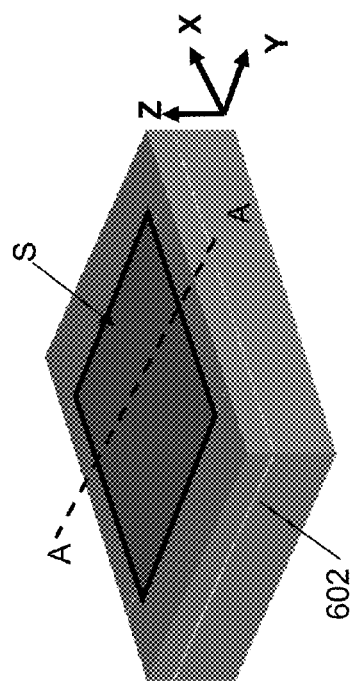
Figure 6B
Figure 6D
Figure 6A
Figure 6C

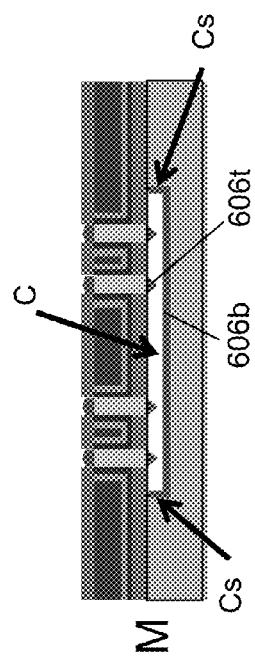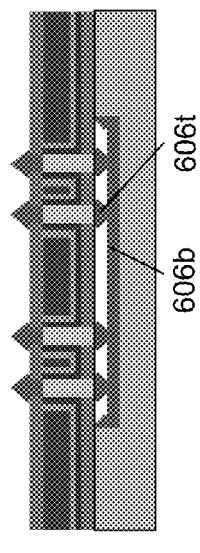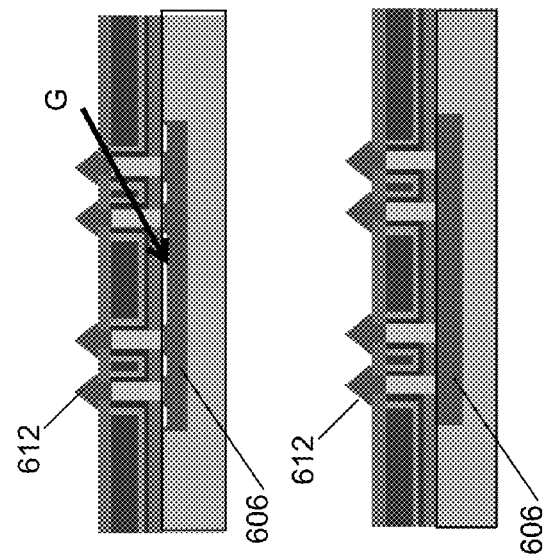
Figure 6M  Figure 6N  Figure 6O  Figure 6P

VERTICAL TRANSISTOR INCLUDING A BOTTOM SOURCE/DRAIN REGION, A GATE STRUCTURE, AND AN AIR GAP FORMED BETWEEN THE BOTTOM SOURCE/DRAIN REGION AND THE GATE STRUCTURE

BACKGROUND OF THE INVENTION

Field of the Invention

The present invention relates to a vertical transistor and, more particularly, to a vertical transistor in which an air gap is formed between the bottom S/D region and the gate structure.

Description of the Related Art

A vertical transistor or vertical field effect transistor (VFET) is a field effect transistor (FET) in which the channel region is perpendicular to the main surface of the substrate. In a VFET, the direction of the current flow between the source and drain regions is normal to the main surface of the substrate.

A typical VFET includes a vertical fin structure (e.g., a vertical fin) that extends upward from the substrate. The fin structure forms the channel region of the transistor. A source/drain (S/D) region is formed in electrical contact with the top and bottom ends of the channel region, and the gate is disposed on one or more of the side walls of the fin structure.

FIGS. 1A-1B illustrate a related art method of forming a vertical transistor (e.g., VFET).

In particular, FIG. 1A illustrates the forming of a patterned doped epitaxial layer 120 (e.g., n-type or p-type) on a substrate 110 (e.g., bulk silicon, strain-relaxed buffer (SRB) silicon germanium, etc.), and the forming of an undoped silicon layer 130 as a channel region for the vertical transistor.

FIG. 1B illustrates the patterning (e.g., etching) of the substrate 110, the patterned doped epitaxial layer 120 and the undoped silicon layer 130, using a mask 140 (e.g., silicon nitride) to form the fin structures 130*f* and the shallow trench isolation (STI) regions 140. Thus, the patterned doped epitaxial layer 120 will form the bottom S/D region of the related art vertical transistor.

SUMMARY

In view of the foregoing and other problems, disadvantages, and drawbacks of the aforementioned conventional devices and methods, an exemplary aspect of the present invention is directed to a vertical transistor which may have a reduced gate capacitance over related art vertical transistors.

An exemplary aspect of the present invention is directed to a vertical transistor which includes a fin structure formed on a substrate, a gate structure formed on the fin structure, and a bottom source/drain (S/D) region formed on the fin structure, such that an air gap is formed between the bottom S/D region and the gate structure.

Another exemplary aspect of the present invention is directed to a method of forming a vertical transistor. The method includes forming a fin structure on a substrate, forming a gate structure on the fin structure, and forming a bottom source/drain (S/D) region on the fin structure, such that an air gap is formed between the bottom S/D region and the gate structure.

Another exemplary aspect of the present invention is directed to a vertical transistor including a fin structure formed on a substrate, a gate structure formed on the fin structure and including a bottom spacer, and a bottom source/drain (S/D) region formed on the fin structure, such that an air gap is formed between the bottom spacer of the bottom S/D region and the gate structure. The bottom S/D region includes a first epitaxial layer which is grown from a bottom portion of the fin structure, a second epitaxial layer which is grown from a surface of the substrate, and merged with the first epitaxial layer, and an insulating layer formed on the substrate, a cavity being formed in the insulating layer and the gate structure extending across the cavity and including opposing end portions which are formed on the insulating layer on opposing sides of the cavity. The bottom S/D region is formed in the cavity, and the gate structure includes a width which is less than a width of the cavity such that an upper surface of the bottom S/D region is formed outside of the gate structure in a plan view.

With its unique and novel features, the present invention provides a vertical transistor which may have a reduced gate capacitance over related art vertical transistors.

BRIEF DESCRIPTION OF THE DRAWINGS

The foregoing and other objects, aspects and advantages will be better understood from the following detailed description of the embodiments of the invention with reference to the drawings, in which:

FIG. 4G illustrates the forming of a gate structure 408, according to an exemplary aspect of the present invention.

FIG. 4H illustrates a cross-sectional view along line B-B in FIG. 4G, according to an exemplary aspect of the present invention.

FIG. 4I illustrates a cross-sectional view along line A-A in FIG. 4G, according to an exemplary aspect of the present invention.

FIG. 6A illustrates the forming of an insulating layer 604 (e.g., an oxide layer such as a silicon oxide layer) on a substrate 602 (e.g., a silicon substrate), according to an exemplary aspect of the present invention.

FIG. 6B illustrates the forming of a sacrificial layer S (e.g., single crystalline material such as silicon germanium, etc.) in the cavity C, according to an exemplary aspect of the present invention.

FIG. 6C illustrates the removal (e.g., by selective etching) of the insulating layer 604a, according to an exemplary aspect of the present invention.

FIG. 6D illustrates a cross-sectional view along line A-A in FIG. 6C, according to an exemplary aspect of the present invention.

FIG. 6M illustrates an early stage of formation of a bottom S/D region 606 and a top S/D region 612 by selective epitaxial growth according to an exemplary aspect of the present invention.

FIG. 6N illustrates a merging of the first and second epitaxial layers 606t, 606b, in the forming of the bottom S/D region 606, according to an exemplary aspect of the present invention.

FIG. 6O illustrates a configuration of the bottom S/D region 606 and the top S/D region 612 (e.g., at completion of epitaxial growth) according to an exemplary aspect of the present invention.

FIG. 6P illustrates a configuration of the bottom S/D region 606 and the top S/D region 612 with further epitaxial growth.

DETAILED DESCRIPTION OF THE EXEMPLARY EMBODIMENTS OF THE INVENTION

Figure 1A:
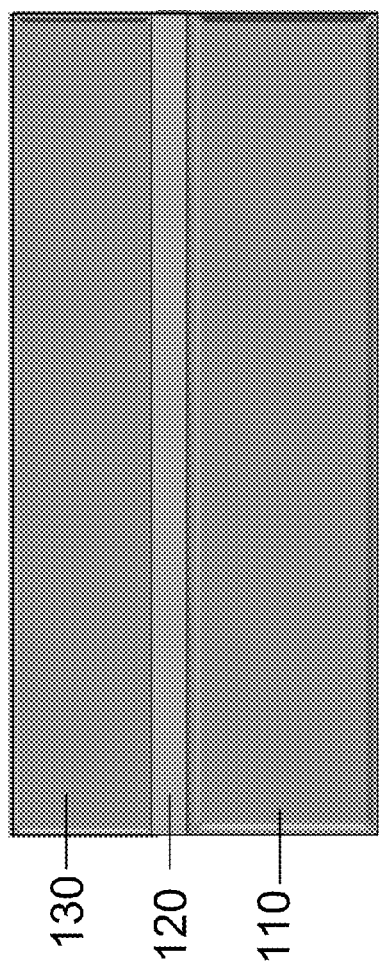
FIGS. 1A-1B illustrate a related art method of forming a vertical transistor (e.g., VFET).

Referring now to the drawings, FIGS. 2A-6R illustrate the exemplary aspects of the present invention.

Figure 1B:
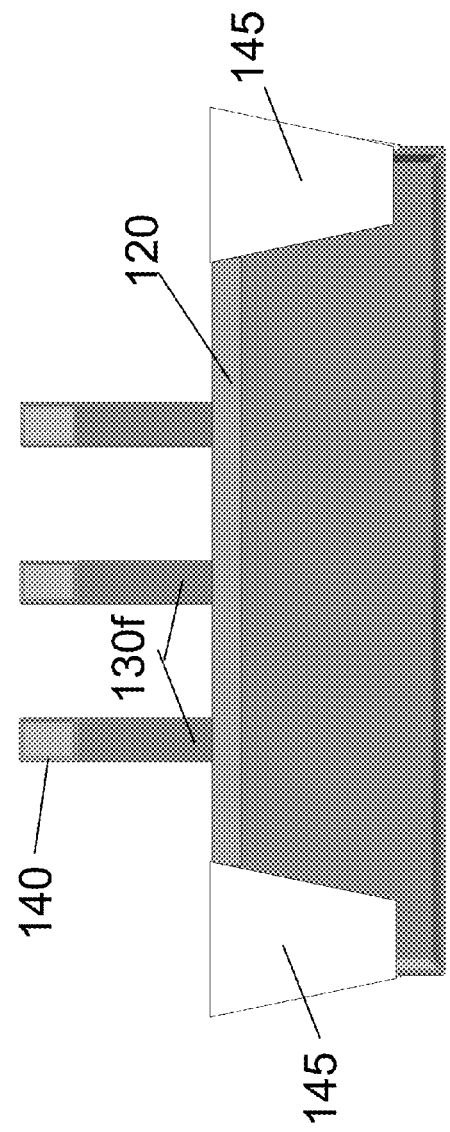

The related art vertical transistor of FIGS. 1A-1B have several problems.

First, in etching (e.g., using reactive ion etching (RIE)) the undoped silicon layer 130 to form the fin structures 130f, the etching will gouge into doped epitaxial layer 120 (e.g., the bottom S/D) because undoped silicon cannot be selectively etched relative to doped silicon, since both are essentially silicon.

Second, there will be some variation in the gouge into the doped epitaxial layer 120 (e.g., bottom S/D) for different pattern densities and pitches of the fin structures 130f. This will likely cause variability in the first spacer and gate alignment to the channel (e.g., fin structure 130f). Third, dopant from the doped epitaxial layer 120 (e.g., bottom S/D) is likely to diffuse into the channel (e.g., fin structure 130f) during downstream processing (e.g., formation of the fin structure 130f, formation of the gate, formation of a spacer module etc.). This will likely result in the formation of a non-controlled junction and an increase in gate capacitance in the related art vertical transistor.

An exemplary aspect of the present invention is directed to a vertical transistor that may have well controlled junction position and reduce a gate capacitance. The vertical transistor may be included, for example, in a memory device.

The vertical transistor includes a fin structure formed on a substrate, a gate structure formed on the fin structure, and a bottom source/drain (S/D) region formed on the fin structure, such that an air gap is formed between the bottom S/D region and the gate structure. The air gap may have a height in a range from 2 nm to 30 nm, and may help to reduce the gate capacitance in the vertical transistor.

The bottom S/D region may include a first epitaxial layer which is grown from a bottom portion of the fin structure, and a second epitaxial layer which is grown from a surface of the substrate, and merged with the first epitaxial layer.

The vertical transistor may also include an insulating layer formed on the substrate, a cavity being formed in the insulating layer and the gate structure extending across the cavity and including opposing end portions which are formed on the insulating layer on opposing sides of the cavity. The bottom S/D region is formed in the cavity, and the gate structure includes a width which is less than a width of the cavity such that an upper surface of the bottom S/D region is formed outside of the gate structure in a plan view.

The gate structure may also include a bottom spacer, the air gap being formed between the bottom S/D region and the bottom spacer. The bottom S/D region may include a lateral growth portion formed on surface of the bottom spacer.

The vertical transistor may also include a top S/D region formed on the fin structure, the top S/D region including an epitaxial layer which is grown from a top portion of the fin structure. The gate structure may also include a top spacer, the top S/D region including a lateral growth portion formed on a surface of the top spacer.

It should be noted that the term "S/D region" as used herein should be construed to mean a diffusion region that could be configured and used as either a source or drain, depending upon the configuration of the vertical transistor. Further, the bottom S/D region and the top S/D region should not be construed to include the same type (e.g., source or drain) of diffusion region. That is, if the bottom S/D region is a source region, then the top S/D region is a drain region, and vice versa.

FIGS. 2A-2D illustrate a vertical transistor 200, according to an exemplary aspect of the present invention.

Figure 2C:
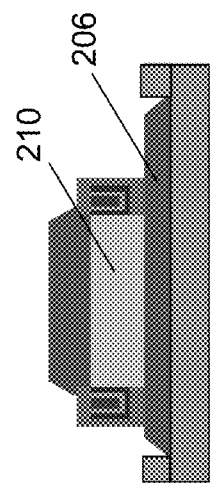
FIG. 2C provides a cross-sectional view of the vertical transistor 200 along the line B-B (i.e., in the Y-direction), according to an exemplary aspect of the present invention.
Figure 2B:
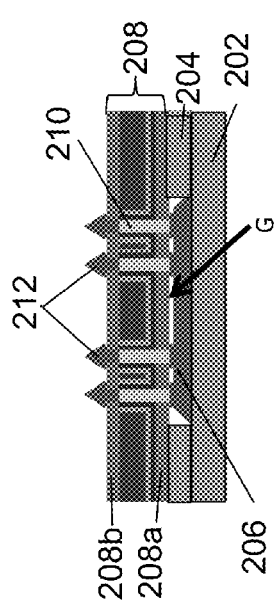
FIG. 2B provides a cross-sectional view of the vertical transistor 200 along the line A-A (i.e., in the X-direction), according to an exemplary aspect of the present invention.
Figure 2D:
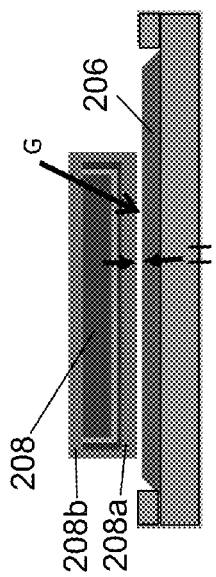
FIG. 2D provides a cross-sectional view of the vertical transistor 200 along the line C-C (i.e., in the Y-direction), according to an exemplary aspect of the present invention.
Figure 2A:
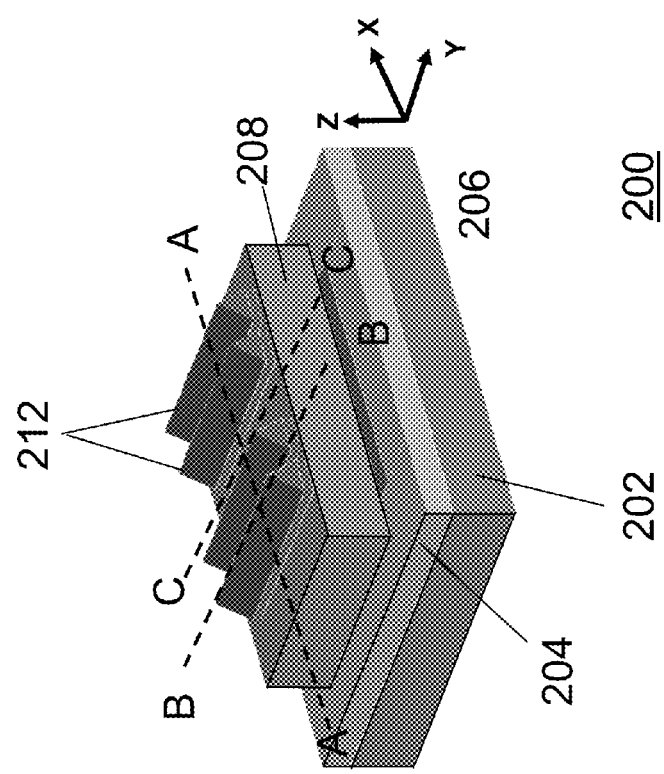
FIG. 2A provides a perspective view of the vertical transistor 200, according to an exemplary aspect of the present invention.

In particular, FIG. 2A provides a perspective view of the vertical transistor 200, according to an exemplary aspect of the present invention.

As illustrated in FIG. 2A, the vertical transistor 200 includes a substrate 202 (e.g., silicon), an insulating layer 204 (e.g., silicon oxide), a bottom S/D region 206, a gate structure 208 formed on a plurality of fin structures 210 (see FIG. 2B below), and a top S/D region 212.

FIG. 2B provides a cross-sectional view of the vertical transistor 200 along the line A-A (i.e., in the X-direction), according to an exemplary aspect of the present invention.

As illustrated in FIG. 2B, the gate structure 208 is formed on the fin structures 210, and includes a bottom spacer 208a formed on a lower portion of the fin structures 210 and on the insulating layer 204, and a top spacer 208b formed on an upper portion of the fin structures 210. The bottom S/D region 206 and the top S/D region 212 are epitaxially grown from the fin structures 210.

As illustrated in FIG. 2B, an air gap G is formed between the gate structure 208 and the bottom S/D region 206. The air gap G may help to reduce a gate capacitance in the vertical transistor 200.

FIG. 2C provides a cross-sectional view of the vertical transistor 200 along the line B-B (i.e., in the Y-direction), according to an exemplary aspect of the present invention. That is, FIG. 2C provides a cross-sectional view through a fin structure 210. As illustrated in FIG. 2C, the bottom S/D region 206 contacts a lower portion of the fin structure 210 (e.g., is continuously formed with the fin structure 210).

FIG. 2D provides a cross-sectional view of the vertical transistor 200 along the line C-C (i.e., in the Y-direction), according to an exemplary aspect of the present invention. That is, FIG. 2D provides a cross-sectional view that is outside of the fin structure 210. As illustrated in FIG. 2D, the air gap G may be formed over an entire width of the gate structure 208. The air gap G may be formed as a space between an upper surface of the bottom S/D region 206, and the bottom spacer 208a of the gate structure 208. A height H in the Z-direction of the air gap G (e.g., a distance between an upper surface of the bottom S/D region 206 and the bottom spacer 208a of the gate structure 208) may be in a range from 2 nm to 30 nm.

In contrast to the related art transistor in FIGS. 1A-1B, in the vertical transistor 200, the bottom S/D region 206 and top S/D region 212 may be epitaxially grown from the fin structures 210, and may be formed at the same time by selective epitaxy growth. In addition, the epitaxial growth of the bottom and top S/D regions 206, 212 may be performed after forming the gate structure 208. Further, the vertical transistor 200 may be formed by using a sacrificial layer to expose the bottom of the fin structures 210 (e.g., the channel region) for growing the bottom S/D region 206. Further, unlike the related art transistor, the vertical transistor 200 includes the air gap G between the bottom S/D region 206 and the gate structure 208, for gate capacitance reduction.

Figure 3:
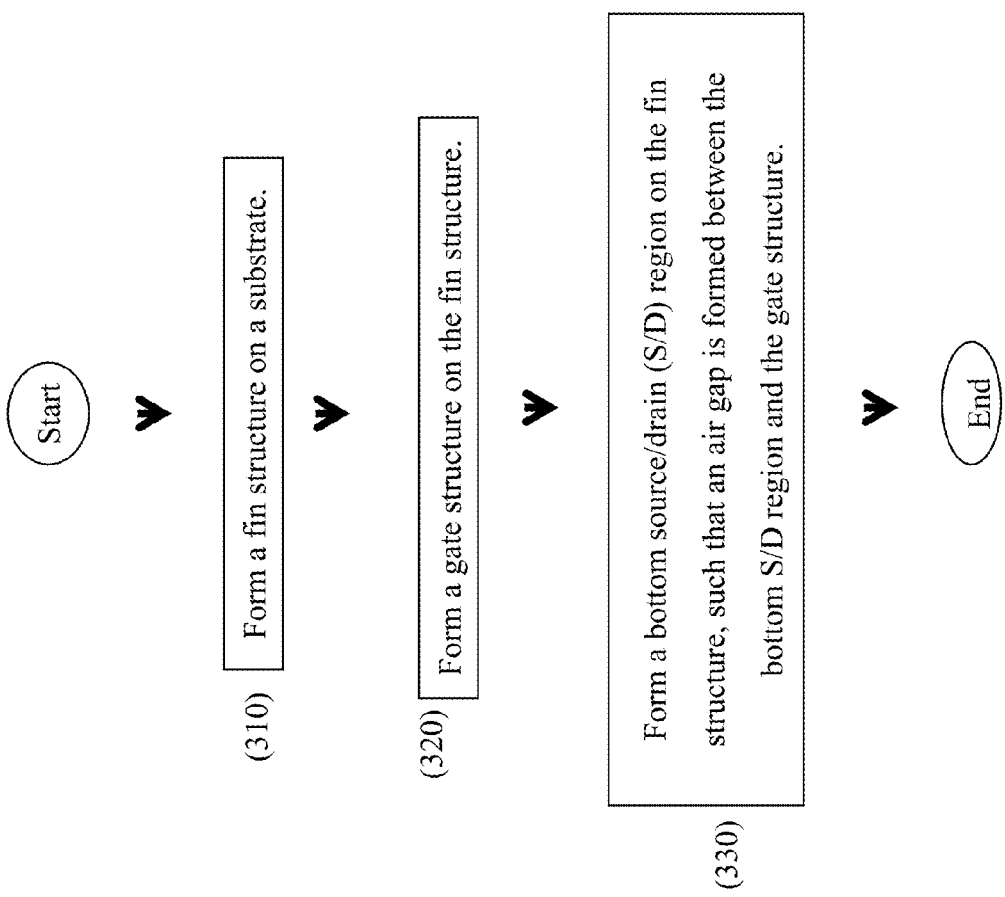
FIG. 3 illustrates a method 300 of forming a vertical transistor (e.g., vertical transistor 200), according to an exemplary aspect of the present invention.

FIG. 3 illustrates a method 300 of forming a vertical transistor (e.g., vertical transistor 200), according to an exemplary aspect of the present invention.

As illustrated in FIG. 3, the method 300 includes forming (310) a fin structure on a substrate, forming (320) a gate structure on the fin structure, and (e.g., after the forming of the gate structure) forming (330) a bottom source/drain (S/D) region on the fin structure, such that an air gap is formed between the bottom S/D region and the gate structure.

The forming (330) of the bottom S/D region may include epitaxially growing a first portion of the bottom S/D region from a bottom portion of the fin structure, and epitaxially growing a second portion of the bottom S/D region from a surface of the substrate, the second portion of the bottom S/D region merging with the first portion of the bottom S/D region to form the bottom S/D region.

The method 300 may also include epitaxially growing a top S/D region from a top portion of the fin structure, and the epitaxially growing of the bottom S/D region may be performed concurrently with the epitaxially growing of the top S/D region.

The method 300 may also include forming an insulating layer on the substrate, forming a cavity in the insulating layer such that a surface of the substrate is exposed through the cavity, and forming a sacrificial layer in the cavity and on the surface of the substrate. The fin structure may be formed on the sacrificial layer, and the gate structure may be formed such that the gate structure extends across the cavity and opposing end portions of the gate structure are formed on the insulating layer on opposing sides of the cavity.

The method 300 may also include removing the sacrificial layer to expose a surface of the substrate and a bottom portion of the fin structure. The bottom S/D region may be epitaxially grown in the cavity from the exposed surface of the substrate and the exposed bottom portion of the fin structure, and the gate structure may include a width which is less than a width of the cavity such that an upper surface of the bottom S/D region is formed outside of the gate structure in a plan view.

Figure 4B:
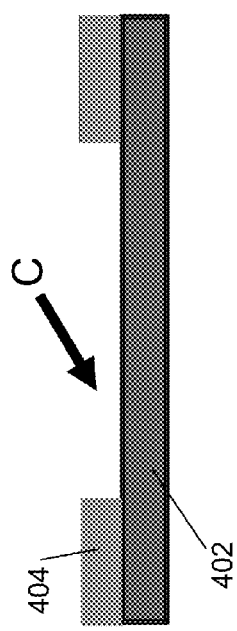
FIG. 4B illustrates a cross-sectional view along line A-A in FIG. 4A, according to an exemplary aspect of the present invention.
Figure 4D:
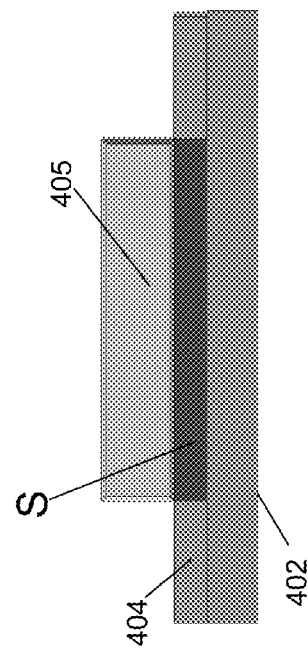
FIG. 4D illustrates a cross-sectional view along line A-A in FIG. 4C, according to an exemplary aspect of the present invention.
Figure 4A:
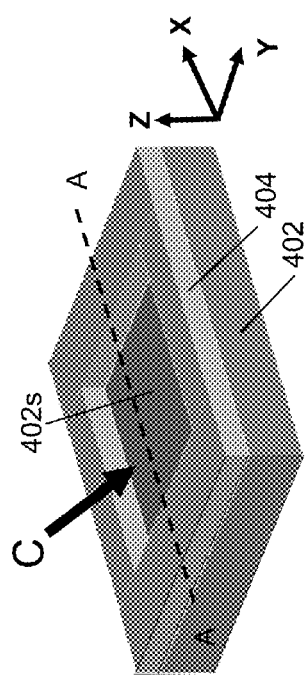
FIG. 4A illustrates the forming of an insulating layer 404 (e.g., an oxide layer such as a silicon oxide layer) on a substrate 402 (e.g., a silicon substrate), according to an exemplary aspect of the present invention.
Figure 4C:
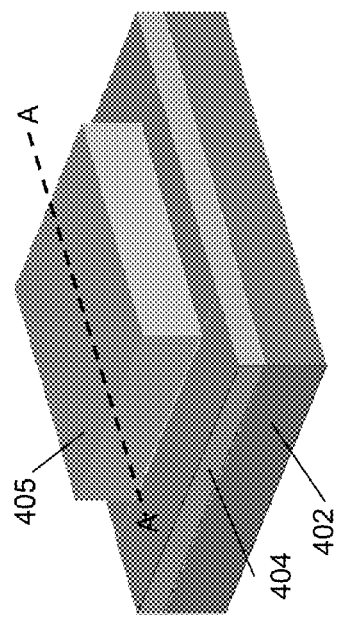
FIG. 4C illustrates the forming of an epitaxial sacrificial layer S and an epitaxial undoped silicon layer 405, according to an exemplary aspect of the present invention.
Figure 4F:
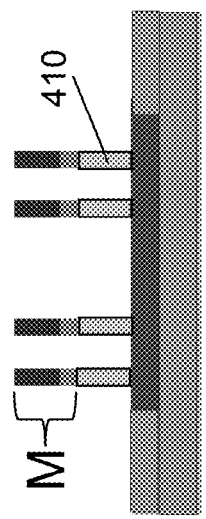
FIG. 4F illustrates a cross-sectional view along line A-A in FIG. 4E, according to an exemplary aspect of the present invention.
Figure 4E:
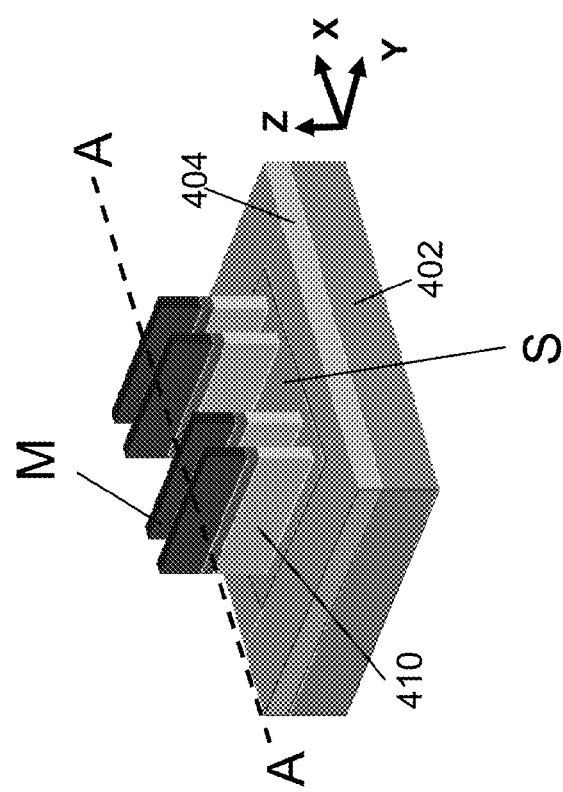
FIG. 4E illustrates the forming of the fin structures 410, according to an exemplary aspect of the present invention.
Figure 4K:
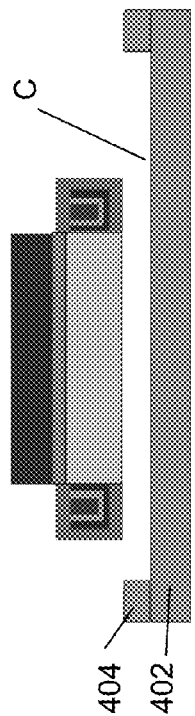
FIG. 4K illustrates a cross-sectional view along line B-B in FIG. 4J, according to an exemplary aspect of the present invention.
Figure 4L:
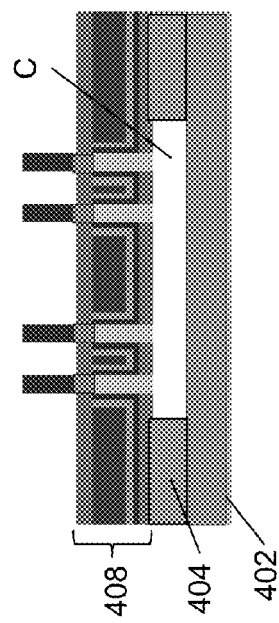
FIG. 4L illustrates a cross-sectional view along line A-A in FIG. 4J, according to an exemplary aspect of the present invention.
Figure 4J:
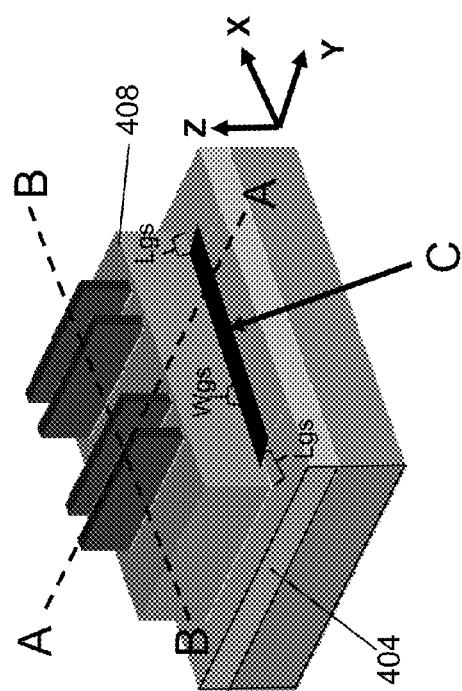
FIG. 4J illustrates the selective etching (e.g., selective etching) of the sacrificial layer S, according to an exemplary aspect of the present invention.
Figure 4M:
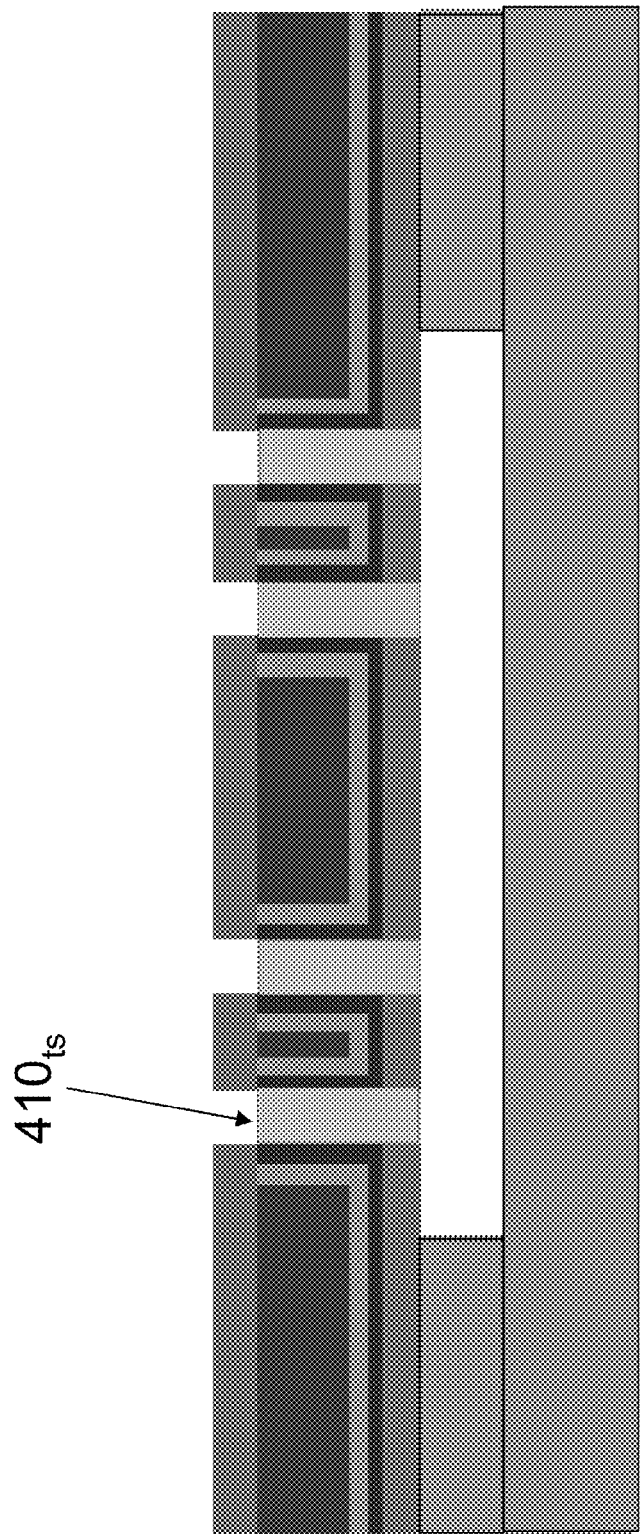
FIG. 4M is a cross-sectional view in the X-direction, and illustrates a removal of the mask M (e.g., a hardmask such as silicon nitride), according to an exemplary aspect of the present invention.
Figure 4N:
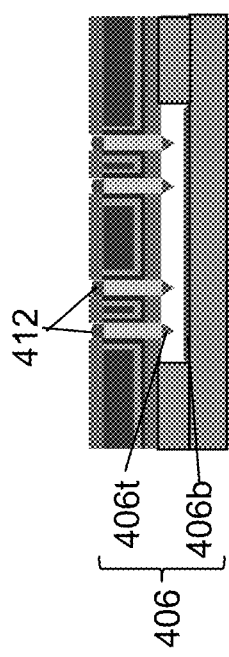
FIG. 4N illustrates an early stage of formation of a bottom S/D region 406 and a top S/D region 412 by selective epitaxial growth according to an exemplary aspect of the present invention.
Figure 4O:
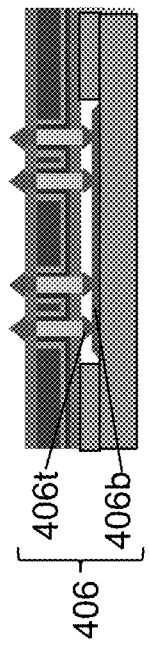
FIG. 4O illustrates a merging of the first and second epitaxial layers 406t, 406b, in the forming of the bottom S/D region 406 according to an exemplary aspect of the present invention.
Figure 4P:
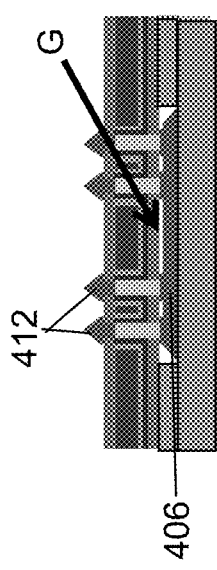
FIG. 4P illustrates a configuration of the bottom S/D region 406 and the top S/D region 412 (e.g., at completion of epitaxial growth) according to an exemplary aspect of the present invention.
Figure 4Q:
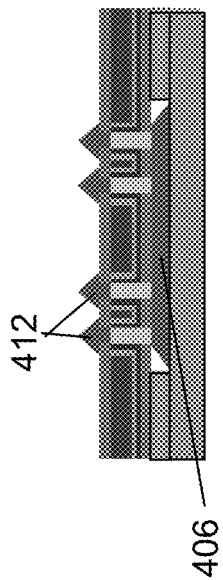
FIG. 4Q illustrates a configuration of the bottom S/D region 406 and the top S/D region 412 with further epitaxial growth.
Figure 4R:
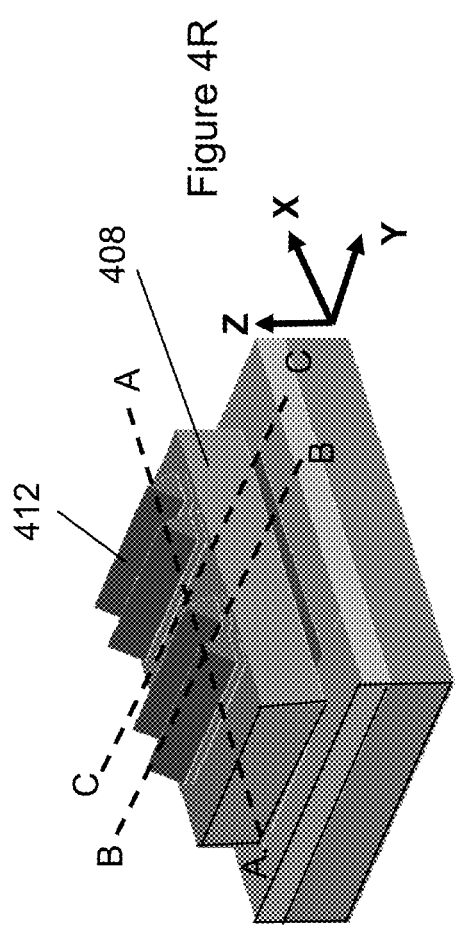
FIG. 4R provides a perspective view of a vertical transistor (e.g., vertical transistor 200), according to an exemplary aspect of the present invention.
Figure 4S:
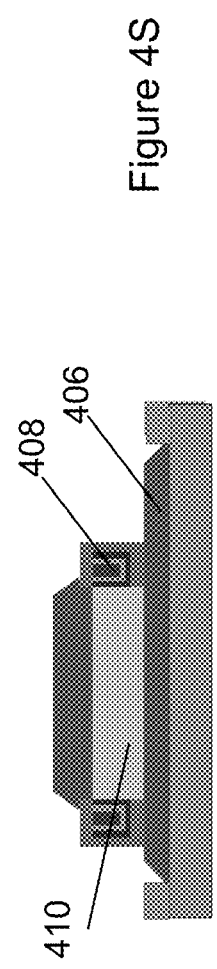
FIG. 4S illustrates a cross-sectional view along line B-B in FIG. 4R, according to an exemplary aspect of the present invention.
Figure 4T:
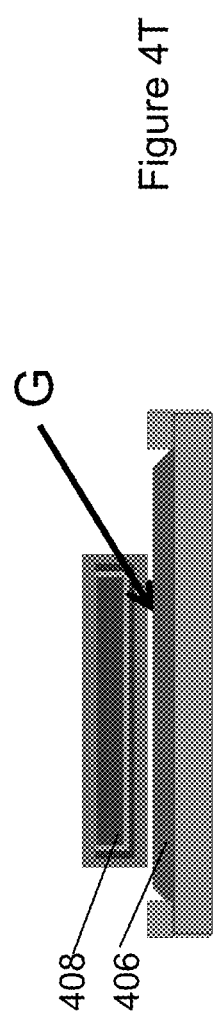
FIG. 4T illustrates a cross-sectional view along line C-C in FIG. 4R, according to an exemplary aspect of the present invention.

FIGS. 4A-4T illustrate a method (e.g., method 300) of forming a vertical transistor (e.g., vertical transistor 200), according to another exemplary aspect of the present invention.

In particular, FIG. 4A illustrates the forming of an insulating layer 404 (e.g., an oxide layer such as a silicon oxide layer) on a substrate 402 (e.g., a silicon substrate), according to an exemplary aspect of the present invention. FIG. 4B illustrates a cross-sectional view along line A-A in FIG. 4A, according to an exemplary aspect of the present invention.

A thickness (e.g., in a vertical direction or Z-direction) of the insulating layer 404 may be in a range from about 5 nm to 50 nm. The insulating layer 404 may be patterned (e.g., etched) so as to include a cavity C formed therein. The cavity C (e.g., hole, recess, etc.) may, for example, have a square shape or rectangle shape in a plan view.

The cavity C penetrates an entire thickness of the insulating layer 404, so that a bottom of the cavity C is defined by a surface 402s of the substrate 402 (i.e., the surface 402s is exposed through the cavity C). The length (in the X-direction) and width (in the Y direction) of the cavity C may be the same or different, and may be determined by designed device size.

FIG. 4C illustrates the forming of an epitaxial sacrificial layer S and an epitaxial undoped silicon layer 405, according to an exemplary aspect of the present invention. FIG. 4D illustrates a cross-sectional view along line A-A in FIG. 4C, according to an exemplary aspect of the present invention.

As illustrated in FIG. 4D, a sacrificial layer S (e.g., single crystalline material such as silicon germanium, etc.) may be formed in the cavity C. The sacrificial layer S may completely fill the cavity C, and a surface of the sacrificial layer S may be planarized (e.g., polished such as by chemical mechanical polishing (CMP)) so as to be coplanar with a surface of the insulating layer 404.

As illustrated in FIG. 4C, the undoped silicon layer 405 may be formed on the sacrificial layer S. The undoped silicon layer 405 may have a thickness in a range from about 5 nm to 50 nm. The length (in the X-direction) and width (in the Y-direction) of the undoped silicon layer 405 may be smaller or larger than that of the sacrificial layer S due to epitaxial growth with facets and/or lateral growth of the undoped silicon layer 405.

FIG. 4E illustrates the forming of the fin structures 410, according to an exemplary aspect of the present invention. FIG. 4F illustrates a cross-sectional view along line A-A in FIG. 4E, according to an exemplary aspect of the present invention.

As illustrated in FIG. 4E, a mask M (e.g., hard mask) may be formed on the undoped silicon layer 405, and used to pattern the undoped silicon layer 405 into the fin structures 410. The mask may be, for example, silicon nitride. The patterning of the undoped silicon layer 405 may be performed, for example, by reactive ion etching (RIE).

A thickness of the fin structures 410 may be substantially the same as the deposited thickness of the undoped silicon layer 405, the length (in the Y-direction) of the fin structures 410 may be determined by designed device size and the width (in the X-direction) of the fin structures 410 may be in a range from about 5 nm to 10 nm which meets performance requirements for 7 nm technology and beyond. Although four (4) fin structures 410 are illustrated in FIGS. 4E-4F, the number of fin structures 410 is not limited to any particular number.

As illustrated in FIG. 4E, the total area covered by the fin structures 410 should be less than the area of the surface of the sacrificial layer S. That is, as illustrated in FIG. 4F, there should be some surface of the sacrificial layer S which is outside the fin structures 410 in a plan view.

FIG. 4G illustrates the forming of a gate structure 408, according to an exemplary aspect of the present invention. FIG. 4H illustrates a cross-sectional view along line B-B in FIG. 4G, according to an exemplary aspect of the present invention. FIG. 4I illustrates a cross-sectional view along line A-A in FIG. 4G, according to an exemplary aspect of the present invention.

The gate structure 408 may be formed in and around the fin structures 410 and contacts a side wall of the fin structures 410. The gate structure 408 may include a bottom spacer 408a and a top spacer 408b. A thickness of the gate structure 408 may be greater than a thickness of the fin structure 410, so that the upper surface of the top spacer 408b may be higher than the upper surface of the fin structures 410, as illustrated clearly in FIG. 4H.

A length (in the X-direction) of the gate structure 408 may be greater than a length of the sacrificial layer S, so that the gate structure 408 is formed on a surface of the insulating layer 404 The length $L_{gs}$ of the gate structure 408 which is formed on the insulating layer 404 (e.g., a distance between an end of the sacrificial layer S and an end of the gate structure 408) should be sufficient long so as to provide structural stability of the gate structure 408 when the sacrificial layer S is removed in a later step. In particular, the length $L_{gs}$ may be in a range from about 5 nm to several micrometer.

The gate structure 408 should not overlap the entire sacrificial layer S in the width direction (the Y-direction). That is, on at least one side of the gate structure 408, there should be some underlap so that a portion of the sacrificial layer S is outside the gate structure 408 in a width direction, in a plan view. The width $W_{gs}$ of the underlapped area (e.g., a distance between a side of the sacrificial layer S and a side of the gate structure 408 in the Y-direction) should be in a range from about 5 nm to several micrometer. This underlapped area may be used in a later step to allow access the sacrificial layer S, and remove (e.g., selective etch) it from out of the cavity C.

FIG. 4J illustrates the etching (e.g., selective etching) of the sacrificial layer S, according to an exemplary aspect of the present invention. FIG. 4K illustrates a cross-sectional view along line B-B in FIG. 4J, according to an exemplary aspect of the present invention. FIG. 4L illustrates a cross-sectional view along line A-A in FIG. 4J, according to an exemplary aspect of the present invention.

The sacrificial layer S may be removed by etching the sacrificial layer S which is exposed in the underlapped area outside of the gate structure 408, so as to reproduce the cavity C in the insulating layer 404 (e.g., see FIG. 4B) (e.g., an entirety of the sacrificial layer S may be removed). That is, the underlapped area allows the etchant to reach the sacrificial layer S under the gate structure 408.

After the removal of the sacrificial layer S, the end portions of the gate structure 408 which are formed on the insulating layer 404 allow the central portion of the gate structure 408 and the fin structures 410 to be suspended over the cavity C, as illustrated in FIG. 4J. As illustrated in FIGS. 4K and 4L, an entirety of the bottom surface of the fin structures 410 is suspended over the cavity C.

FIG. 4M is a cross-sectional view in the X-direction, and illustrates a removal of the mask M (e.g., a hardmask such as silicon nitride), according to an exemplary aspect of the present invention.

As illustrated in FIG. 4M, the mask M may be removed by etching. The removal of the mask M exposes the top surface $410_{ts}$ of the fin structures 410 through the top spacer 408b.

FIGS. 4N-4Q provide a cross-sectional view in the X-direction, and illustrate a formation of a bottom S/D region 406 and a top S/D region 412 according to an exemplary aspect of the present invention. In particular, a thickness of the epitaxial growth to form the bottom S/D region 406 and top S/D region 412 increases from FIG. 4N to FIG. 4Q.

In particular, FIG. 4N illustrates an early stage of formation of a bottom S/D region 406 and a top S/D region 412 according to an exemplary aspect of the present invention. As illustrated in FIG. 4N, the bottom S/D region 406 and top S/D region 412 may be formed by selective epitaxial growth (e.g., in situ doped). Further, the bottom S/D region may be formed in the cavity C by epitaxial growth of the exposed surface of the substrate 402 and the exposed bottom portion of the fin structures 410.

The bottom S/D region may be formed by growing a first epitaxial layer 406t which is grown from a bottom portion of the fin structure, and growing (e.g., simultaneously with the growing of the first epitaxial layer 406t) a second epitaxial layer 406b which is grown from a surface of the substrate 402 in the cavity C, and merged with the first epitaxial layer 406t.

FIG. 4O illustrates a merging of the first and second epitaxial layers 406t, 406b, in the forming of the bottom S/D region 406 according to an exemplary aspect of the present invention.

FIG. 4P illustrates a configuration of the bottom S/D region 406 and the top S/D region 412 (e.g., at completion of epitaxial growth) according to an exemplary aspect of the present invention. As illustrated in FIG. 4P, the air gap G is formed between the bottom S/D region 406 and the gate structure 408.

FIG. 4Q illustrates a configuration of the bottom S/D region 406 and the top S/D region 412 with further epitaxial growth. As illustrated in FIGS. 4O and 4P, the air gap G may be eliminated by further epitaxial growth. However, as noted above, it is preferable to form the air gap G between the bottom S/D region 406 and the gate structure 408, in order to reduce gate capacitance.

FIG. 4R provides a perspective view of a vertical transistor (e.g., vertical transistor 200), according to an exemplary aspect of the present invention. FIG. 4S illustrates a cross-sectional view along line B-B in FIG. 4R, according to an exemplary aspect of the present invention. FIG. 4T illustrates a cross-sectional view along line C-C in FIG. 4R, according to an exemplary aspect of the present invention.

As illustrated in FIG. 4R, a lateral growth of the top S/D region 412 may be formed on the gate structure 408.

As illustrated in FIG. 4S, the bottom S/D region 406 may contact the gate structure 408 at the ends of the fin structure 410. Further, the bottom S/D region 406 does not necessarily fill the cavity C, but may leave a portion of the cavity empty along a sidewall of the cavity C in the Y-direction (e.g., in the underlapped area).

As illustrated in FIG. 4T, the air gap G is formed between the bottom S/D region 406 and the gate structure 408.

FIGS. 5A-5H illustrate a method of forming a vertical transistor, according to another exemplary aspect of the present invention.

Figure 5A:
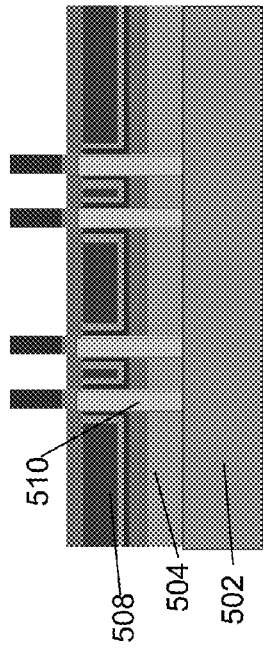
FIG. 5A illustrates the formation of fin structures 510, according to an exemplary aspect of the present invention.

In particular, FIG. 5A illustrates the formation of fin structures 510, according to an exemplary aspect of the present invention. As illustrated in FIG. 5A, the fin structures 510 (e.g., undoped silicon) are formed on the substrate 502 (e.g., silicon substrate) (e.g., by patterning a layer of undoped silicon using the mask M), and an insulating layer 504 (e.g., a local oxide, silicon oxide, etc.) is formed on the substrate 502 and around the fin structures 510.

Figure 5B:
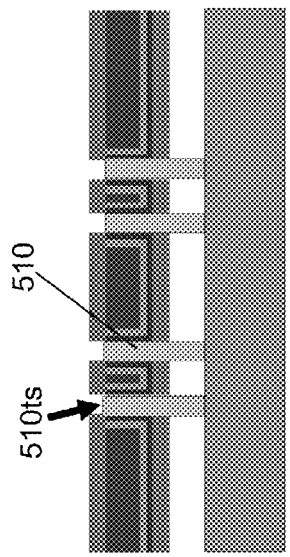
FIG. 5B illustrates the formation of a gate structure 508 on the insulating layer 504 and around the fin structures 510, according to an exemplary aspect of the present invention.

FIG. 5B illustrates the formation of a gate structure 508 on the insulating layer 504 and around the fin structures 510, according to an exemplary aspect of the present invention.

Figure 5C:
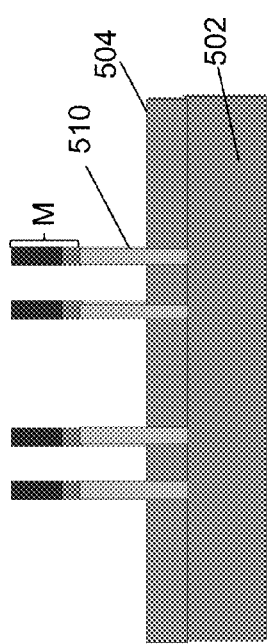
FIG. 5C illustrates the removal of the insulating layer 504 (e.g., by selective etching), according to an exemplary aspect of the present invention.

FIG. 5C illustrates the removal of the insulating layer 504 (e.g., by selective etching), according to an exemplary aspect of the present invention. That is, in the method 500, instead of using the sacrificial layer L, the insulating layer 504 is used as a sacrificial layer. As illustrated in FIG. 5C, the removal of the insulating layer 504 creates a cavity C between the substrate 502 and the gate structure 508, so that a central portion of the gate structure 508 may be suspended over the cavity C by the fin structures 510.

Figure 5D:
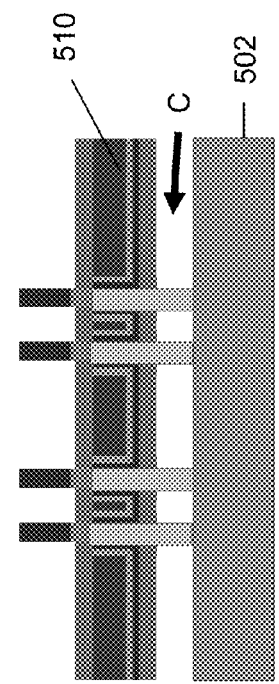
FIG. 5D illustrates the removal of the mask M (e.g., by etching) to expose a top surface 510ts of the fin structures 510, according to an exemplary aspect of the present invention.

FIG. 5D illustrates the removal of the mask M (e.g., by etching) to expose a top surface $510ts$ of the fin structures 510, according to an exemplary aspect of the present invention.

FIGS. 5E-5H provide a cross-sectional view in the X-direction, and illustrate a formation of a bottom S/D region 506 (e.g., by cladding epitaxy) and a top S/D region 512 (e.g., by embedded epitaxy) according to an exemplary aspect of the present invention. In particular, a thickness of the epitaxial growth used to form the bottom S/D region 506 and top S/D region 512 increases from FIG. 5E to FIG. 5H.

Figure 5E:
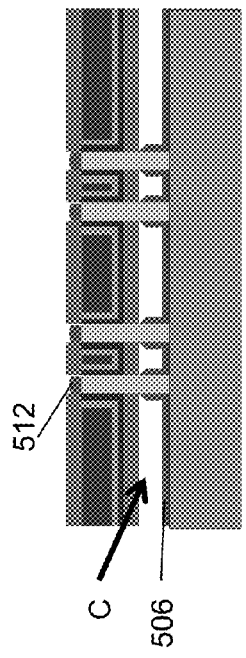
FIG. 5E illustrates an early stage of formation of a bottom S/D region 506 and a top S/D region 512 by selective epitaxial growth according to an exemplary aspect of the present invention.

In particular, FIG. 5E illustrates an early stage of formation of a bottom S/D region 506 and a top S/D region 512 according to an exemplary aspect of the present invention. As illustrated in FIG. 5E, the bottom S/D region 506 and top S/D region 512 may be formed by selective epitaxial growth (e.g., in situ doped). Further, the bottom S/D region 506 may be formed in the cavity C by epitaxial growth of the exposed surface of the substrate 502 and the exposed sidewalls of the fin structures 510. That is, unlike in the method 400 where the bottom S/D region 506 may be formed by epitaxial growth downward from the bottom surface of the fin structure 510, in the method 500, the bottom S/D region 506 may be formed by epitaxial growth laterally (e.g., in the X-direction) from a side surface of the fin structures 510.

Figure 5F:
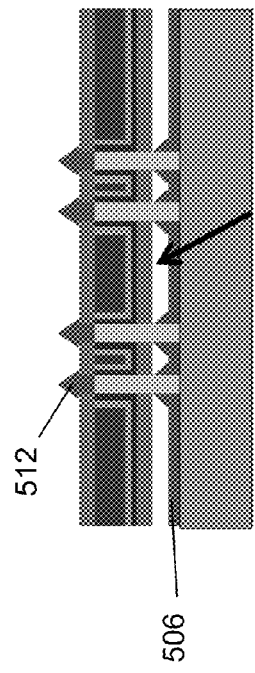
FIG. 5F illustrates a further formation (e.g., epitaxial growth) of the bottom S/D region 506 and the top S/D region 512, according to an exemplary aspect of the present invention.

FIG. 5F illustrates a further formation (e.g., epitaxial growth) of the bottom S/D region 506 and the top S/D region 512, according to an exemplary aspect of the present invention.

Figure 5G:
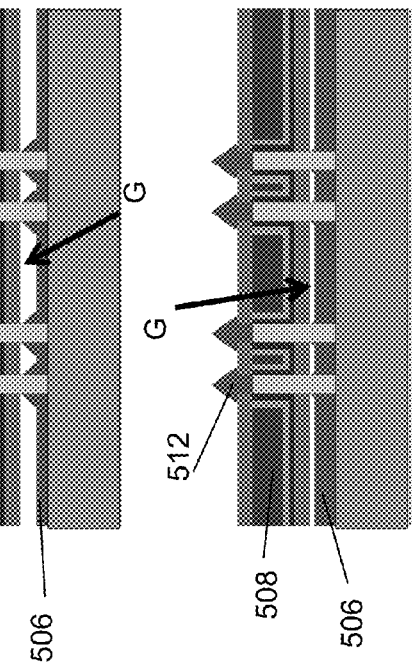
FIG. 5G illustrates a configuration of the bottom S/D region 506 and the top S/D region 512 (e.g., at completion of epitaxial growth) according to an exemplary aspect of the present invention.

FIG. 5G illustrates a configuration of the bottom S/D region 506 and the top S/D region 512 (e.g., at completion of epitaxial growth) according to an exemplary aspect of the present invention. As illustrated in FIGS. 5F and 5G, the air gap G is formed between the bottom S/D region 506 and the gate structure 508.

Figure 5H:
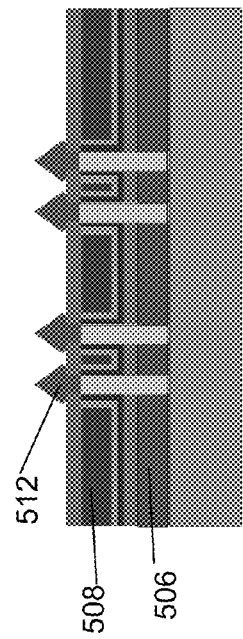
FIG. 5H illustrates a configuration of the bottom S/D region 506 and the top S/D region 512 with further epitaxial growth, according to an exemplary aspect of the present invention.

FIG. 5H illustrates a configuration of the bottom S/D region 506 and the top S/D region 512 with further epitaxial growth, according to an exemplary aspect of the present invention. As illustrated in FIG. 5H, the air gap G may be eliminated by further epitaxial growth. However, as noted above, it is preferable to form the air gap G between the bottom S/D region 506 and the gate structure 508, in order to reduce gate capacitance.

Figure 6E:
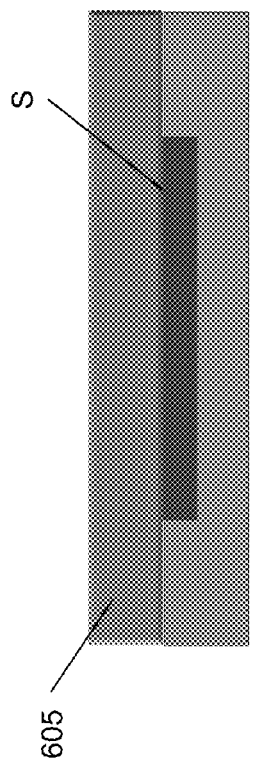
FIG. 6E illustrates the forming of an epitaxial undoped silicon layer 605, according to an exemplary aspect of the present invention.
Figure 6G:
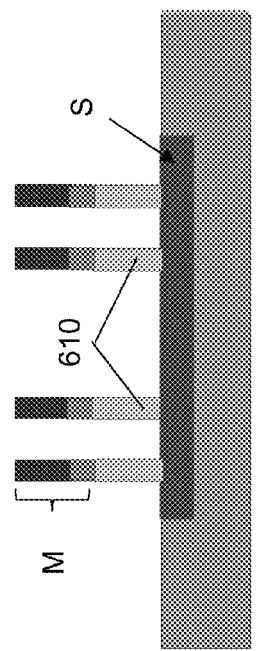
FIG. 6G illustrates a cross-sectional view along line A-A in FIG. 6F, according to an exemplary aspect of the present invention.
Figure 6F:
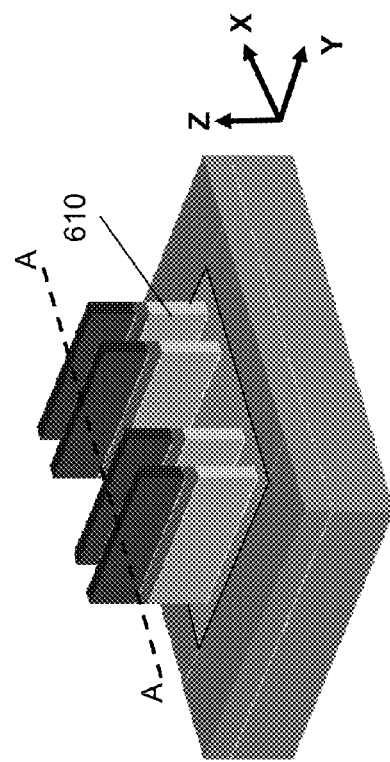
FIG. 6F illustrates the patterning of the epitaxial undoped silicon layer 605 to form a plurality of fin structures 610, according to an exemplary aspect of the present invention.
Figure 6I:
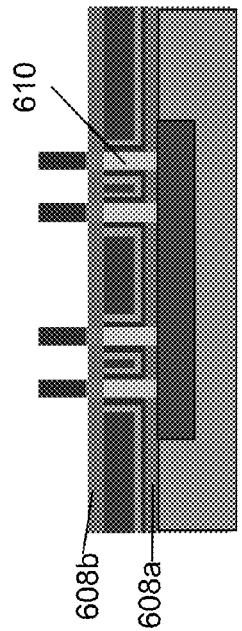
FIG. 6I illustrates a cross-sectional view along line A-A in FIG. 6H, according to an exemplary aspect of the present invention.
Figure 6K:
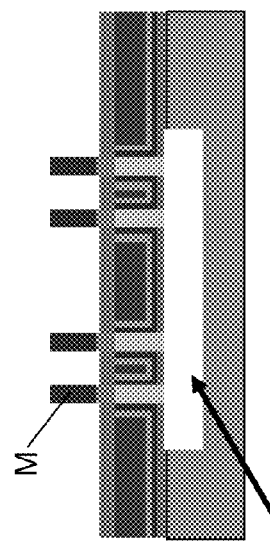
FIG. 6K illustrates a cross-sectional view along line A-A in FIG. 6J, according to an exemplary aspect of the present invention.
Figure 6L:
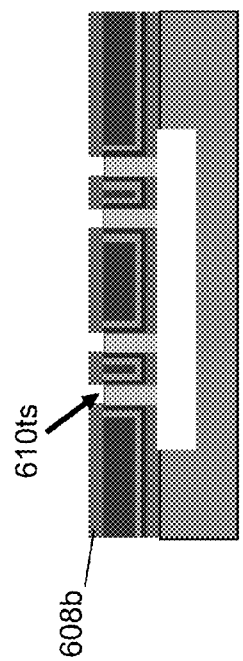
FIG. 6L is a cross-sectional view in the X-direction, and illustrates a removal of the mask M (e.g., a hardmask such as silicon nitride), according to an exemplary aspect of the present invention.
Figure 6H:
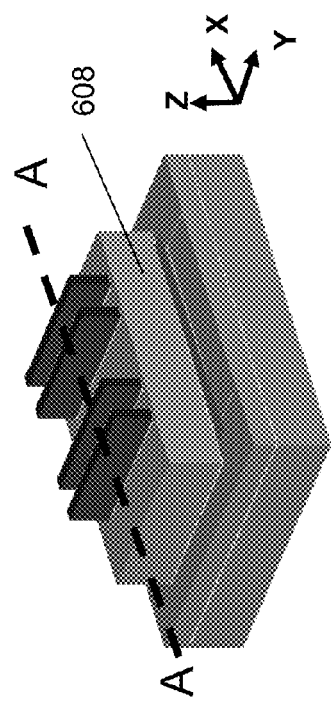
FIG. 6H illustrates the forming of a gate structure 608, according to an exemplary aspect of the present invention.
Figure 6J:
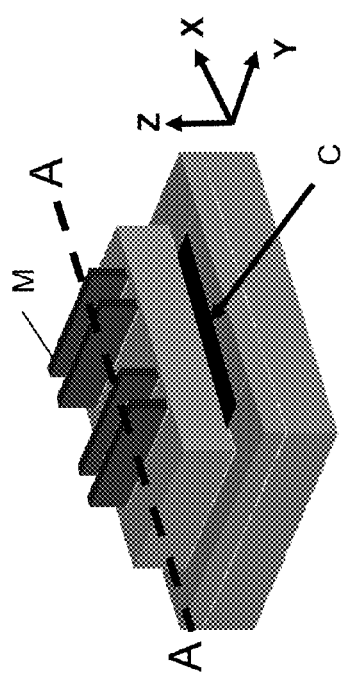
FIG. 6J illustrates the removal (e.g., etching, selective etching, etc.) of the sacrificial layer S, according to an exemplary aspect of the present invention.
Figure 6Q:
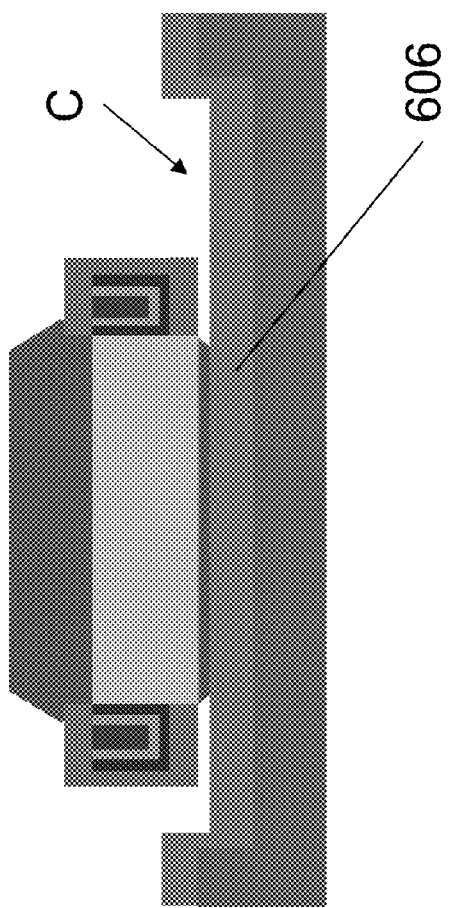
FIG. 6Q illustrates a cross-sectional view through a fin structure 610 and in the Y-direction of the vertical transistor illustrated in FIG. 6O, according to an exemplary aspect of the present invention.
Figure 6R:
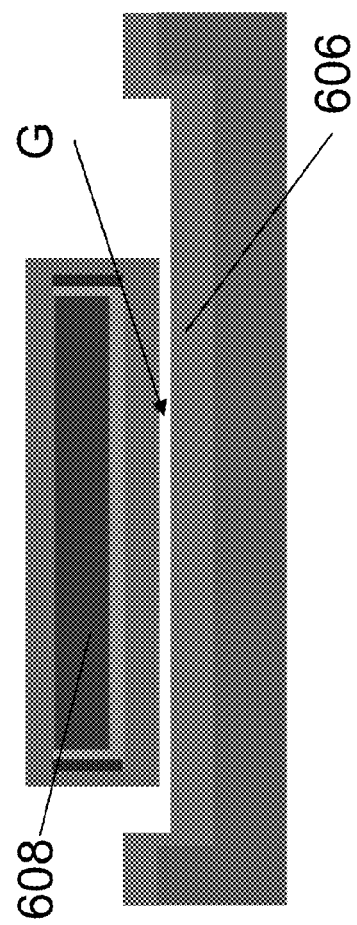
FIG. 6R illustrates a cross-sectional view outside a fin structure 610 and in the Y-direction of the vertical transistor illustrated in FIG. 6O, according to an exemplary aspect of the present invention.

FIGS. 6A-6R illustrate a method of forming a vertical transistor, according to another exemplary aspect of the present invention.

In particular, FIG. 6A illustrates the forming of an insulating layer 604 (e.g., an oxide layer such as a silicon oxide layer) on a substrate 602 (e.g., a silicon substrate), according to an exemplary aspect of the present invention.

A thickness (e.g., in a vertical direction or Z-direction) of the insulating layer 604 may be in a range from about 5 nm to 50 nm. The insulating layer 604 may be patterned (e.g., etched) so as to include a cavity C formed therein. The cavity C (e.g., hole, recess, etc.) may, for example, have a square shape or rectangle shape in a plan view.

The cavity C penetrates an entire thickness of the insulating layer 604, so that a bottom of the cavity C is defined by a surface 602s of the substrate 602 (i.e., the surface 602s is exposed through the cavity C). The length (in the X-direction) and width (in the Y direction) of the cavity C may be the same or different, and may be determined by designed device size.

As illustrated in FIG. 6B, a sacrificial layer S (e.g., single crystalline material such as silicon germanium, etc.) may be formed in the cavity C. The sacrificial layer S may completely fill the cavity C formed in the substrate 602. FIG. 6C illustrates the removal (e.g., by etching) of the insulating layer 604a, according to an exemplary aspect of the present invention. The surface of the sacrificial layer S may be planarized (e.g., polished such as by chemical mechanical polishing (CMP)) so as to be coplanar with a surface of the substrate 602.

FIG. 6D illustrates a cross-sectional view along line A-A in FIG. 6C, according to an exemplary aspect of the present invention. As illustrated in FIG. 6D, an upper surface of the sacrificial layer S may be coplanar with an upper surface of the substrate 402.

FIG. 6E illustrates the forming of an epitaxial undoped silicon layer 605, according to an exemplary aspect of the present invention.

As illustrated in FIG. 6E, the undoped silicon layer 605 may be formed on the sacrificial layer S. The undoped silicon layer 605 may have a thickness in a range from about 10 nm to 100 nm. The length (in the X-direction) and width (in the Y-direction) of the undoped silicon layer 605 may not have to be substantially the same as that of the sacrificial layer S. FIG. 6F illustrates the patterning of the undoped silicon layer 605 to form a plurality of fin structures 610, according to an exemplary aspect of the present invention. FIG. 6G illustrates a cross-sectional view along line A-A in FIG. 6F, according to an exemplary aspect of the present invention.

As illustrated in FIG. 6F, a mask M (e.g., hard mask) may be formed on the undoped silicon layer 605, and used to pattern the undoped silicon layer 605 into the fin structures 610. The mask M may be, for example, silicon nitride. The patterning of the undoped silicon layer 605 may be performed, for example, by reactive ion etching (RIE).

FIG. 6H illustrates the forming of a gate structure 608, according to an exemplary aspect of the present invention. FIG. 6I illustrates a cross-sectional view along line A-A in FIG. 6H, according to an exemplary aspect of the present invention.

The gate structure 608 may be formed in and around the fin structures 610 and contacts a side wall of the fin structures 610. The gate structure 608 may include a bottom spacer 608a and a top spacer 608b. A thickness of the gate structure 608 may be greater than a thickness of the fin structure 610, so that the upper surface of the top spacer 608b may be higher than the upper surface of the fin structures 610, as illustrated clearly in FIG. 6I.

FIG. 6J illustrates the removal (e.g., etching, selective etching, etc.) of the sacrificial layer S, according to an exemplary aspect of the present invention. FIG. 6K illustrates a cross-sectional view along line A-A in FIG. 6J, according to an exemplary aspect of the present invention.

After the removal of the sacrificial layer S, the cavity C in the substrate 602 is restored.

FIG. 6L is a cross-sectional view in the X-direction, and illustrates a removal of the mask M (e.g., a hardmask such as silicon nitride), according to an exemplary aspect of the present invention.

As illustrated in FIG. 6L, the mask M may be removed by etching. The removal of the mask M exposes the top surface $610_{ts}$ of the fin structures 610 through the top spacer 608b.

FIGS. 6M-6P provide a cross-sectional view in the X-direction, and illustrate a formation of a bottom S/D region 606 and a top S/D region 612 according to an exemplary aspect of the present invention. In particular, a thickness of the epitaxial growth used to form the bottom S/D region 606 and top S/D region 612 increases from FIG. 6M to FIG. 6P.

In particular, FIG. 6M illustrates an early stage of formation of a bottom S/D region 606 and a top S/D region 612 according to an exemplary aspect of the present invention. As illustrated in FIG. 6M, the bottom S/D region 606 and top S/D region 612 may be formed by selective epitaxial growth (e.g., in situ doped). Further, the bottom S/D region may be formed in the cavity C by epitaxial growth of the exposed surface of the substrate 602 and the exposed bottom portion (e.g., bottom surface) of the fin structures 610.

The bottom S/D region may be formed by growing a first epitaxial layer 606t which is grown from a bottom portion of the fin structure, and growing (e.g., simultaneously with the growing of the first epitaxial layer 606t) a second epitaxial layer 606b which is grown from a surface of the substrate 602 in the cavity C, and merged with the first epitaxial layer 606t.

As illustrated in FIG. 6M, unlike in the method illustrated in FIGS. 4A-4T, in this method, the second epitaxial layer 606b may also be grown laterally from a sidewall Cs of the cavity C.

FIG. 6N illustrates a merging of the first and second epitaxial layers 606t, 606b, in the forming of the bottom S/D region 606, according to an exemplary aspect of the present invention.

FIG. 6O illustrates a configuration of the bottom S/D region 606 and the top S/D region 612 (e.g., at completion of epitaxial growth) according to an exemplary aspect of the present invention. As illustrated in FIGS. 6M and 6N, the air gap G is formed between the bottom S/D region 606 and the gate structure 608.

FIG. 6P illustrates a configuration of the bottom S/D region 606 and the top S/D region 612 with further epitaxial growth. As illustrated in FIG. 6P, the air gap G may be eliminated by further epitaxial growth. However, as noted above, it is preferable to form the air gap G between the bottom S/D region 606 and the gate structure 608, in order to reduce gate capacitance.

FIG. 6Q illustrates a cross-sectional view through a fin structure 610 and in the Y-direction of the vertical transistor illustrated in FIG. 6N, according to an exemplary aspect of the present invention. As illustrated in FIG. 6Q, a lateral growth of the bottom S/D region 606 may extend out of the cavity C and onto an upper surface of the substrate 602.

FIG. 6R illustrates a cross-sectional view outside a fin structure 610 and in the Y-direction of the vertical transistor illustrated in FIG. 6N, according to an exemplary aspect of the present invention.

As illustrated in FIG. 6R, the air gap G is formed between the bottom S/D region 606 and the gate structure 608.

With its unique and novel features, the present invention provides a vertical transistor which may have a reduced gate capacitance over related art vertical transistors.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A vertical transistor comprising:
   a fin structure formed on a substrate;
   a gate structure formed on the fin structure; and
   a bottom source/drain (S/D) region formed on the fin structure, such that an air gap is formed between the bottom S/D region and the gate structure.

2. The vertical transistor of claim 1, wherein the bottom S/D region comprises:
   a first epitaxial layer which is grown from a bottom portion of the fin structure.

3. The vertical transistor of claim 2, wherein the bottom S/D region further comprises:
   a second epitaxial layer which is grown from a surface of the substrate, and merged with the first epitaxial layer.

4. The vertical transistor of claim 1, wherein the air gap has a height in a range from 2 nm to 30 nm.

5. The vertical transistor of claim 1, further comprising:
   an insulating layer formed on the substrate, a cavity being formed in the insulating layer and the gate structure extending across the cavity and comprising opposing end portions which are formed on the insulating layer on opposing sides of the cavity.

6. The vertical transistor of claim 5, wherein the bottom S/D region is formed in the cavity, and the gate structure comprises a width which is less than a width of the cavity such that an upper surface of the bottom S/D region is formed outside of the gate structure in a plan view.

7. The vertical transistor of claim 1, wherein the gate structure comprises a bottom spacer, the air gap being formed between the bottom S/D region and the bottom spacer.

8. The vertical transistor of claim 7, wherein the bottom S/D region comprises a lateral growth portion formed on surface of the bottom spacer.

9. The vertical transistor of claim 1, further comprising:
   a top S/D region formed on the fin structure, the top S/D region comprising an epitaxial layer which is grown from a top portion of the fin structure.

10. The vertical transistor of claim 9, wherein the gate structure comprises a top spacer, the top S/D region comprising a lateral growth portion formed on a surface of the top spacer.

11. A vertical transistor comprising:
    a fin structure formed on a substrate;
    a gate structure formed on the fin structure and including a bottom spacer; and
    a bottom source/drain (S/D) region formed on the fin structure, such that an air gap is formed between the bottom spacer of the bottom S/D region and the gate structure, the bottom S/D region comprising:
       a first epitaxial layer which is grown from a bottom portion of the fin structure;
       a second epitaxial layer which is grown from a surface of the substrate, and merged with the first epitaxial layer; and
    an insulating layer formed on the substrate, a cavity being formed in the insulating layer and the gate structure extending across the cavity and comprising opposing end portions which are formed on the insulating layer on opposing sides of the cavity,
    wherein the bottom S/D region is formed in the cavity, and the gate structure comprises a width which is less than a width of the cavity such that an upper surface of the bottom S/D region is formed outside of the gate structure in a plan view.

* * * * *